United States Patent
Oliveti et al.

(10) Patent No.: US 12,243,717 B2
(45) Date of Patent: Mar. 4, 2025

(54) VARIABLE REACTANCE DEVICE HAVING ISOLATED GATE DRIVE POWER SUPPLIES

(71) Applicant: COMET TECHNOLOGIES USA, INC., San Jose, CA (US)

(72) Inventors: Anthony Oliveti, San Jose, CA (US); J. Kirkwood Rough, San Jose, CA (US)

(73) Assignee: COMET TECHNOLOGIES USA, INC., San Jose, CA (US)

( * ) Notice: Subject to any disclaimer, the term of this patent is extended or adjusted under 35 U.S.C. 154(b) by 341 days.

(21) Appl. No.: 17/712,801

(22) Filed: Apr. 4, 2022

(65) Prior Publication Data
US 2023/0317413 A1  Oct. 5, 2023

(51) Int. Cl.
H01J 37/32 (2006.01)
(52) U.S. Cl.
CPC ...... H01J 37/32183 (2013.01); H01J 37/321 (2013.01)
(58) Field of Classification Search
CPC .......................... H01J 37/32183; H01J 37/321
See application file for complete search history.

(56) References Cited

U.S. PATENT DOCUMENTS

| | | |
|---|---|---|
| 4,679,007 A | 7/1987 | Reese et al. |
| 5,175,472 A | 12/1992 | Johnson, Jr. et al. |
| 5,195,045 A | 3/1993 | Keane et al. |
| 5,394,061 A | 2/1995 | Fujii |
| 5,474,648 A | 12/1995 | Patrick et al. |

(Continued)

FOREIGN PATENT DOCUMENTS

| | | |
|---|---|---|
| JP | 04239211 A | 8/1992 |
| JP | 05284046 A | 8/1993 |

(Continued)

OTHER PUBLICATIONS

PCT/US2018/062951—International Search Report and Written Opinion of International Searching Authority, dated Aug. 28, 2019, 10 pages.

(Continued)

*Primary Examiner* — Henry Luong
(74) *Attorney, Agent, or Firm* — NOLTE LACKENBACH SIEGEL; N. Alexander Nolte

(57) ABSTRACT

The present disclosure relates to a switching circuitry for a variable reactance matching network as may be used by plasma generation systems which utilize plasma for semiconductor processing. The switching circuitry may be used within a hybrid matching network that has a first-stage switched matching network and a second-stage mechanically-tuned matching network. The switching circuitry may also be used for variable reactance matching in telecom applications, plasma laser cutting applications, and/or RADAR/LIDAR implementations. The switching circuitry includes individual isolated power supplies that are fed from a main power supply. The individual isolated power supplies receive inductive power from a main power supply loop powered by the main power supply. The inductive coupling provides isolated power supply loops to drive circuitry for a single switch. Multiple instances of the isolated switch circuitry are used to receive a digital signal from a connected controller.

20 Claims, 5 Drawing Sheets

(56) References Cited

U.S. PATENT DOCUMENTS

| | | |
|---|---|---|
| 5,576,629 A | 11/1996 | Turner et al. |
| 5,609,737 A | 3/1997 | Fukui et al. |
| 5,629,653 A | 5/1997 | Stimson |
| 5,737,175 A | 4/1998 | Grosshart et al. |
| 5,792,261 A | 8/1998 | Hama et al. |
| 5,810,963 A | 9/1998 | Tomioka |
| 5,842,154 A | 11/1998 | Harnett et al. |
| 5,849,136 A | 12/1998 | Mintz et al. |
| 5,866,869 A | 2/1999 | Schneider |
| 5,889,252 A | 3/1999 | Williams et al. |
| 5,910,886 A | 6/1999 | Coleman |
| 5,914,974 A | 6/1999 | Partlo |
| 6,016,131 A | 1/2000 | Sato et al. |
| 6,157,179 A | 12/2000 | Miermans |
| 6,164,241 A | 12/2000 | Chen et al. |
| 6,252,354 B1 | 6/2001 | Collins et al. |
| 6,313,584 B1 | 11/2001 | Johnson et al. |
| 6,313,587 B1 | 11/2001 | MacLennan et al. |
| 6,326,597 B1 | 12/2001 | Lubomirsky et al. |
| 6,407,648 B1 | 6/2002 | Johnson |
| 6,455,437 B1 | 9/2002 | Davidow et al. |
| 6,463,875 B1 | 10/2002 | Chen et al. |
| 6,507,155 B1 | 1/2003 | Barnes et al. |
| 6,677,828 B1 | 1/2004 | Harnett et al. |
| 6,703,080 B2 | 3/2004 | Reyzelman |
| 6,806,437 B2 | 10/2004 | Oh |
| 6,876,155 B2 | 4/2005 | Howald et al. |
| 6,894,245 B2 | 5/2005 | Hoffman |
| 6,949,887 B2 | 9/2005 | Kirkpatrick et al. |
| 7,030,335 B2 | 4/2006 | Hoffman |
| 7,042,311 B1 | 5/2006 | Hilliker et al. |
| 7,079,597 B1 | 7/2006 | Kenwood |
| 7,102,292 B2 | 9/2006 | Parsons et al. |
| 7,192,505 B2 | 3/2007 | Roche et al. |
| 7,196,283 B2 | 3/2007 | Buchberger, Jr |
| 7,215,697 B2 | 5/2007 | Hill et al. |
| 7,220,937 B2 | 5/2007 | Hoffman |
| 7,251,121 B2 | 7/2007 | Bhutta |
| 7,259,623 B2 | 8/2007 | Coleman |
| 7,298,128 B2 | 11/2007 | Bhutta |
| 7,467,612 B2 | 12/2008 | Suckewer |
| 7,514,936 B2 | 4/2009 | Anwar |
| 7,795,877 B2 | 9/2010 | Radtke |
| 7,796,368 B2 | 9/2010 | Kotani |
| 8,169,162 B2 | 5/2012 | Yuzurihara |
| 8,203,372 B2 | 6/2012 | Arduini |
| 8,222,822 B2 | 7/2012 | Gilbert |
| 8,421,377 B2 | 4/2013 | Kirchmeier |
| 8,466,622 B2 | 6/2013 | Knaus |
| 8,471,746 B2 | 6/2013 | Kurunezi et al. |
| 8,491,759 B2 | 7/2013 | Pipitone et al. |
| 8,742,669 B2 | 6/2014 | Carter et al. |
| 8,779,662 B2 | 7/2014 | Boston |
| 8,803,424 B2 | 8/2014 | Boston |
| 8,884,180 B2 | 11/2014 | Ilie |
| 8,896,391 B2 | 11/2014 | du Toit |
| 8,928,229 B2 | 1/2015 | Boston |
| 9,042,121 B2 | 5/2015 | Walde et al. |
| 9,065,426 B2 | 6/2015 | Mason et al. |
| 9,105,447 B2 | 8/2015 | Brouk et al. |
| 9,111,725 B2 | 8/2015 | Boston |
| 9,124,248 B2 | 9/2015 | Van Zyl et al. |
| 9,142,388 B2 | 9/2015 | Hoffman et al. |
| 9,148,086 B2 | 9/2015 | Fife et al. |
| 9,166,481 B1 | 10/2015 | Vinciarelli |
| 9,171,700 B2 | 10/2015 | Gilmore |
| 9,196,459 B2 | 11/2015 | Bhutta |
| 9,208,992 B2 | 12/2015 | Brouk et al. |
| 9,224,579 B2 | 12/2015 | Finley et al. |
| 9,225,299 B2 | 12/2015 | Mueller et al. |
| 9,287,098 B2 | 3/2016 | Finley et al. |
| 9,294,100 B2 | 3/2016 | Van Zyl et al. |
| 9,306,533 B1 | 4/2016 | Mavretic |
| 9,313,870 B2 | 4/2016 | Walde et al. |
| 9,337,804 B2 | 5/2016 | Mason et al. |
| 9,345,122 B2 | 5/2016 | Bhutta |
| 9,385,021 B2 | 7/2016 | Chen |
| 9,418,822 B2 | 8/2016 | Kaneko |
| 9,478,397 B2 | 10/2016 | Blackburn et al. |
| 9,483,066 B2 | 11/2016 | Finley et al. |
| 9,490,353 B2 | 11/2016 | Van Zyl et al. |
| 9,496,122 B1 | 11/2016 | Bhutta |
| 9,520,269 B2 | 12/2016 | Finley et al. |
| 9,524,854 B2 | 12/2016 | Hoffman et al. |
| 9,525,412 B2 | 12/2016 | Mavretic |
| 9,536,713 B2 | 1/2017 | Van Zyl et al. |
| 9,543,122 B2 | 1/2017 | Bhutta |
| 9,544,987 B2 | 1/2017 | Mueller et al. |
| 9,558,917 B2 | 1/2017 | Finley et al. |
| 9,577,516 B1 | 2/2017 | Van Zyl et al. |
| 9,584,090 B2 | 2/2017 | Mavretic |
| 9,578,731 B2 | 3/2017 | Hoffman et al. |
| 9,591,739 B2 | 3/2017 | Bhutta |
| 9,589,767 B2 | 4/2017 | Finley et al. |
| 9,620,340 B2 | 4/2017 | Finley et al. |
| 9,651,957 B1 | 5/2017 | Finley et al. |
| 9,660,613 B2 | 5/2017 | Van Zyl et al. |
| 9,673,028 B2 | 6/2017 | Walde et al. |
| 9,697,911 B2 | 7/2017 | Bhutta |
| 9,711,331 B2 | 7/2017 | Mueller et al. |
| 9,711,335 B2 | 7/2017 | Christie et al. |
| 9,728,378 B2 | 8/2017 | Bhutta et al. |
| 9,729,122 B2 | 8/2017 | Mavretic |
| 9,741,544 B2 | 8/2017 | Van Zyl et al. |
| 9,745,660 B2 | 8/2017 | Bhutta |
| 9,748,076 B1 | 8/2017 | Choi et al. |
| 9,755,641 B1 | 9/2017 | Bhutta |
| 9,773,644 B2 | 9/2017 | Van Zyl et al. |
| 9,807,863 B1 | 10/2017 | Van Zyl et al. |
| 9,812,305 B2 | 11/2017 | Pelleymounter et al. |
| 9,844,127 B2 | 12/2017 | Bhutta |
| 9,852,890 B2 | 12/2017 | Mueller et al. |
| 9,854,659 B2 | 12/2017 | Van Zyl et al. |
| 9,865,432 B1 | 1/2018 | Bhutta |
| 9,952,297 B2 | 4/2018 | Wang |
| 10,008,317 B2 | 6/2018 | Iyer |
| 10,020,752 B1 | 7/2018 | Vinciarelli |
| 10,026,592 B2 | 7/2018 | Chen |
| 10,026,594 B2 | 7/2018 | Bhutta |
| 10,026,595 B2 | 7/2018 | Choi et al. |
| 10,074,518 B2 | 9/2018 | Van Zyl et al. |
| 10,139,285 B2 | 11/2018 | Murray et al. |
| 10,141,788 B2 | 11/2018 | Kamstedt |
| 10,194,518 B2 | 1/2019 | Van Zyl et al. |
| 10,217,618 B2 | 2/2019 | Larson et al. |
| 10,224,184 B2 | 3/2019 | Van Zyl |
| 10,224,186 B2 | 3/2019 | Polak et al. |
| 10,263,577 B2 | 4/2019 | Van Zyl et al. |
| 10,269,540 B1 | 4/2019 | Carter et al. |
| 10,314,156 B2 | 6/2019 | Van Zyl et al. |
| 10,332,730 B2 | 6/2019 | Christie et al. |
| 10,340,879 B2 | 7/2019 | Mavretic |
| 10,373,811 B2 | 8/2019 | Christie et al. |
| 10,374,070 B2 | 8/2019 | Wood |
| 10,410,836 B2 | 9/2019 | McChesney |
| 10,411,769 B2 | 9/2019 | Bae |
| 10,447,174 B1 | 10/2019 | Porter, Jr. et al. |
| 10,469,108 B2 | 11/2019 | Howald |
| 10,475,622 B2 | 11/2019 | Pankratz et al. |
| 2003/0121609 A1 | 7/2003 | Ohmi et al. |
| 2003/0150710 A1 | 8/2003 | Evans et al. |
| 2003/0230984 A1 | 12/2003 | Kitamura et al. |
| 2004/0016402 A1 | 1/2004 | Walther et al. |
| 2004/0026235 A1 | 2/2004 | Stowell, Jr. |
| 2005/0034811 A1 | 2/2005 | Mahoney et al. |
| 2005/0045475 A1 | 3/2005 | Wantanabe |
| 2005/0270805 A1 | 12/2005 | Yasumura |
| 2006/0005928 A1 | 1/2006 | Howald |
| 2006/0169582 A1 | 8/2006 | Brown et al. |
| 2006/0169584 A1 | 8/2006 | Brown et al. |
| 2006/0249729 A1 | 11/2006 | Mundt et al. |
| 2007/0121267 A1 | 5/2007 | Kotani |
| 2007/0222428 A1 | 9/2007 | Garvin et al. |
| 2008/0061793 A1 | 3/2008 | Anwar et al. |

(56) References Cited

U.S. PATENT DOCUMENTS

| | | |
|---|---|---|
| 2008/0061901 A1 | 3/2008 | Gilmore |
| 2008/0087381 A1 | 4/2008 | Shannon et al. |
| 2008/0100230 A1* | 5/2008 | Lin .................. H05B 41/2827 |
| | | 315/219 |
| 2008/0197854 A1 | 8/2008 | Valcore et al. |
| 2008/0272875 A1 | 11/2008 | Huang et al. |
| 2008/0317974 A1 | 12/2008 | de Vries |
| 2009/0026964 A1 | 1/2009 | Knaus |
| 2009/0206974 A1 | 8/2009 | Meinke |
| 2010/0012029 A1 | 1/2010 | Forester et al. |
| 2010/0072172 A1 | 3/2010 | Ui et al. |
| 2010/0096261 A1 | 4/2010 | Hoffman et al. |
| 2010/0098882 A1 | 4/2010 | Lubomirsky et al. |
| 2010/0159120 A1 | 6/2010 | Dzengeleski et al. |
| 2011/0121735 A1 | 5/2011 | Penny |
| 2011/0140607 A1 | 6/2011 | Moore et al. |
| 2011/0148303 A1 | 6/2011 | Van Zyl et al. |
| 2011/0174777 A1 | 7/2011 | Jensen et al. |
| 2012/0097104 A1 | 4/2012 | Pipitone et al. |
| 2012/0097524 A1 | 4/2012 | Pipitone et al. |
| 2012/0145322 A1 | 6/2012 | Gushiken et al. |
| 2012/0164834 A1 | 6/2012 | Jennings et al. |
| 2012/0262064 A1 | 10/2012 | Nagarkatti |
| 2013/0002136 A1 | 1/2013 | Blackburn et al. |
| 2013/0140984 A1 | 6/2013 | Hirayama |
| 2013/0180964 A1 | 7/2013 | Ilic |
| 2013/0214683 A1 | 8/2013 | Valcore et al. |
| 2013/0240482 A1 | 9/2013 | Nam et al. |
| 2013/0278140 A1 | 10/2013 | Mudunuri et al. |
| 2013/0345847 A1 | 12/2013 | Valcore et al. |
| 2014/0225504 A1 | 8/2014 | Kaneko |
| 2014/0239813 A1 | 8/2014 | Van Zyl |
| 2014/0265911 A1 | 9/2014 | Kamata et al. |
| 2014/0328027 A1 | 11/2014 | Zhang et al. |
| 2014/0367043 A1 | 12/2014 | Bishara et al. |
| 2015/0002020 A1 | 1/2015 | Boston |
| 2015/0115797 A1 | 4/2015 | Yuzurihara |
| 2015/0150710 A1 | 6/2015 | Evans et al. |
| 2015/0313000 A1 | 10/2015 | Thomas et al. |
| 2015/0349750 A1 | 12/2015 | Van Zyl et al. |
| 2016/0002020 A1 | 1/2016 | Orita |
| 2016/0226553 A1* | 8/2016 | Jin .......................... H03F 3/211 |
| 2016/0248396 A1 | 8/2016 | Mavretic |
| 2016/0308560 A1 | 10/2016 | Howald et al. |
| 2017/0018349 A1 | 1/2017 | Otsubo et al. |
| 2017/0133886 A1 | 5/2017 | Kurs et al. |
| 2017/0330729 A1 | 11/2017 | Mavretic |
| 2017/0338081 A1 | 11/2017 | Yamazawa |
| 2017/0345620 A1 | 11/2017 | Coumou et al. |
| 2018/0034446 A1 | 1/2018 | Wood |
| 2018/0102238 A1 | 4/2018 | Gu et al. |
| 2018/0261431 A1 | 9/2018 | Hammond, IV |
| 2019/0157042 A1* | 5/2019 | Van Zyl ............ H01J 37/32697 |
| 2019/0172683 A1 | 6/2019 | Mavretic |
| 2019/0199241 A1 | 6/2019 | Satoshi et al. |
| 2019/0229603 A1 | 7/2019 | Dubois et al. |
| 2019/0385822 A1 | 12/2019 | Marakhtanov et al. |
| 2020/0083022 A1 | 3/2020 | Huang et al. |
| 2020/0212868 A1 | 7/2020 | Morii |
| 2021/0013009 A1 | 1/2021 | Oliveti et al. |

FOREIGN PATENT DOCUMENTS

| | | | |
|---|---|---|---|
| JP | 2006-310245 | A | 6/2008 |
| JP | 2010-016124 | A | 1/2010 |
| JP | 2015-502213 | A | 1/2015 |
| KR | 10-2006-0067957 | A | 6/2006 |
| KR | 10-2014-0077866 | A | 6/2014 |
| KR | 10-2017-0127724 | A | 11/2017 |
| KR | 10-2018-0038596 | A | 4/2018 |
| WO | 2012054305 | | 4/2012 |
| WO | 2012054306 | | 4/2012 |
| WO | 2012054307 | | 4/2012 |
| WO | 2016048449 | A1 | 3/2016 |
| WO | 2016097730 | | 6/2016 |
| WO | 2019096564 | A1 | 5/2019 |
| WO | 2019147513 | A1 | 8/2019 |
| WO | 2019-244734 | A1 | 12/2019 |

OTHER PUBLICATIONS

Stowell, et al., "RF-superimposed DC and pulsed DC sputtering for deposition of transparent conductive oxides", Thin Solid Films 515 (2007), pp. 7654-7657.

Bender, et al., "Characterization of a RF=do-magnetron discharge for the sputter deposition of transparent and highly conductive ITO films", Appl. Phys. A 69, (1999), pp. 397-409.

Economou, Demetre J., "Fundamentals and application of ion-ion plasmas", Applied Surface Science 253 (2007), pp. 6672-6680.

Godyak et al., "Plasma parameter evolution in a periodically pulsed ICP", XXVIIth, Eindhoven, the Netherlands, Jul. 8-22, 2005, 4 pages.

Banna, et al., "Inductively Coupled Pulsed Plasmas in the Presence of Synchronous Pulsed Substrate Bias for Robust, Reliable, and Fine Conductor Etching", IEEE Transactions on Plasma Science, vol. 37, No. 9, Sep. 2009, pp. 1730-1746.

Kushner, Mark J., "Pulsed Plasmas as a Method to Improve Uniformity During Materials Processing", Journal of Applied Physics, Jul. 1, 2004, vol. 96, No. 1, pp. 82-93.

LTM Technologies, M. Haass "Synchronous Plasma Pulsing for Etch Applications", Apr. 3, 2010 16 pages.

PCT/US2020/038892—International Search Report and Written Opinion of the International Searching Authority, dated Oct. 6, 2020, 3 pages.

PCT/US2020/038899—International Search Report and Written Opinion of the International Searching Authority, dated Sep. 26, 2019, 5 pages.

PCT/US2021/012847—International Search Report and Written Opinion of the International Searching Authority, dated May 6, 2021, 11 pages.

PCT/US2021/012849 International Search Report and Written Opinion of the International Searching Authority, dated May 10, 2021, 11 pages.

PCT/US2021/012851 International Search Report and Written Opinion of the International Searching Authority, dated May 6, 2021, 10 pages.

PCT/US2023/065274-International Search Report and Written Opinion of the International Searching Authority, dated Jul. 27, 2023, 9 pages.

* cited by examiner

VARIABLE REACTANCE DEVICE HAVING ISOLATED GATE DRIVE POWER SUPPLIES

BACKGROUND

In semiconductor manufacturing, plasma processing chambers utilize radio frequency ("RF") power to generate plasma. Plasma is typically created and maintained by an electric current alternating at an RF frequency, which excites and ionizes the source gas used in the plasma chamber. Plasma processing chambers may be used for industrial processes such as, but not limited to, surface treatment of materials or plasma etching during a semiconductor fabrication process. To achieve efficient power transfer between a RF generator and a plasma load, an impedance-matching network is generally used to match a load impedance to a source impedance (e.g., 50 Ohms).

The plasma chamber presents electrical impedance that may vary greatly and quickly. The output impedance of the RF power generator should be closely matched to the rapidly-changing load impedance of the plasma chamber to avoid damaging reflections of power back into the output circuitry of the RF power generator, which can occur when the impedances are mismatched. Impedance matching devices (e.g., matching networks) are used to match the load impedance of the plasma processing chamber to the output impedance of the RF power generator. For rapidly-varying load impedance, the matching network has to dynamically match the impedance accordingly.

In some implementations of a plasma chamber, a low frequency solid-state capacitor uses a symmetric silicon-carbide MOSFET (metal-oxide-semiconductor field-effect transistor) switch connected to a logic controller to provide the matching. Other transistor types could also be used in addition to or in replacement of the MOSFET. The switch acts as the element to bring the reactive component, for example, a capacitor, into and out of the circuit. These switches and reactive elements may be arranged in a binary parallel arrangement, and the actuation of some number of these devices results in the tuning of the device. The disclosed arrangement of isolated gate drive power supplies provides an improvement over previously known implementations of this type of switch.

It should be understood that the background is provided to aid in an understanding of the present disclosure and that nothing in the background section shall be construed as an admission of prior art in relation to the embodiments described herein.

SUMMARY

In an embodiment, a switch circuitry is provided that includes an isolated power supply for each switch within the circuit. The use of the isolated power supplies that are each fed using magnetic inductance from a main power supply provides for an improved function of the switch when used in a matching network such as those used in variable reactance matching networks.

These and other aspects of the present disclosure are described in greater detail below with reference to the accompanying figures.

DETAILED DESCRIPTION

Figure 1:
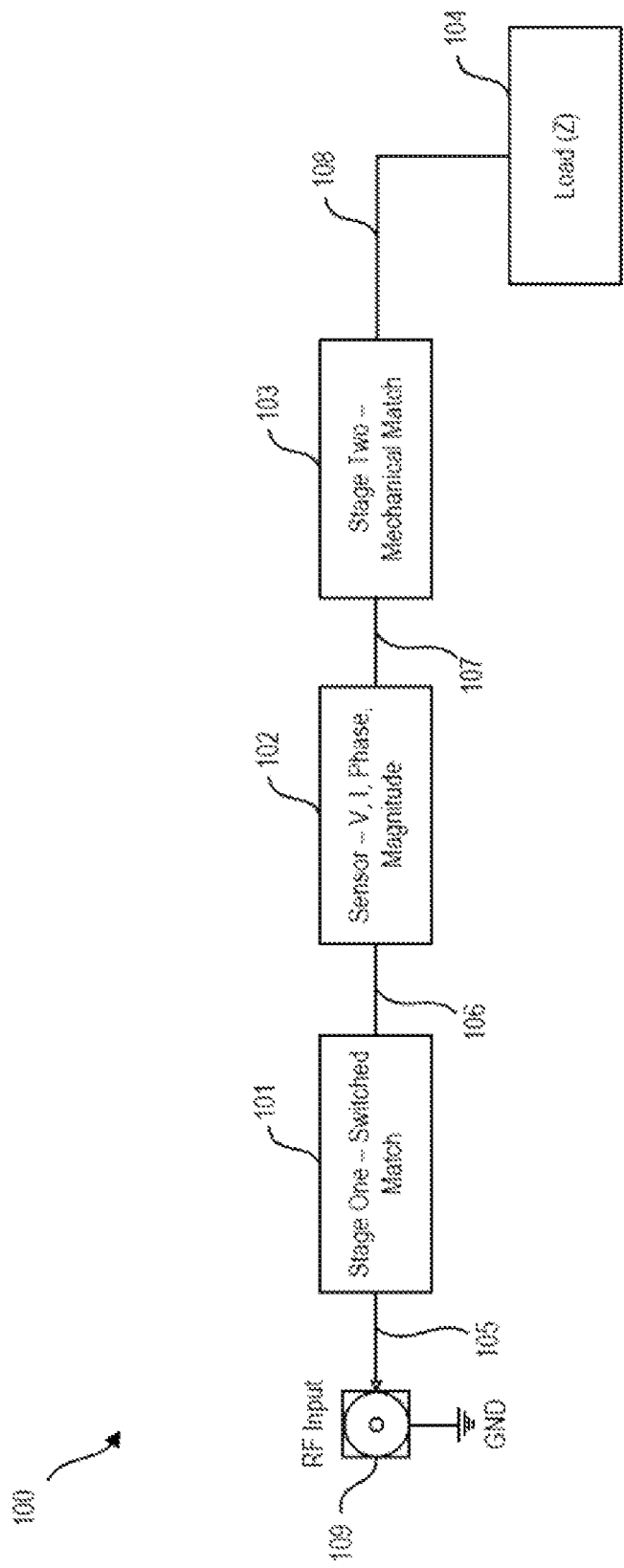
FIG. 1 is a block diagram of a hybrid matching network, according to the present disclosure.

Various embodiments and aspects of the present disclosure will be described with reference to the accompanying drawings. The following description and drawings are illustrative of the present disclosure and are not to be construed as limited the disclosure. Numerous specific details are described to provide a thorough understanding of various embodiments of the present disclosure. However, in certain circumstances, well-known or conventional details are not described in order to provide a concise discussion of embodiments of the present disclosure. As is standard in the practice of providing drawings, the drawings are not necessarily to scale relative to each other and like elements are given the same reference numbers in the different views.

Disclosed is a variable reactance device that has isolated gate drive power supplies in the form of an isolated induction power loop. The isolation of the power supplies is provided, in part, because the switch is directly in series with the reactive element. The isolation is also provided during construction as a symmetric switch. In the disclosed design, the gate drives for each bit are to be fully isolated from each other and from a main power supply. The gate and source connections of each field effect transistor ("FET") are to be actuated with a high degree of galvanic and electromagnetic isolation to prevent the state of one switch from influencing any of the other nearby switches (e.g., via electrical interference).

In some conventional solutions, the isolation is achieved by isolating the gate drive circuitry from the switch and coupling the gate drive energy to the MOSFET or FET using a transformer or some other method. In contrast, the disclosed isolation technique provides for each switch to have an isolated power supply to provide power for gate drive circuitry local to the variable reactance device.

The disclosed switch circuitry provides for a variable reactance device for the purpose of high power impedance matching. The switch circuitry is comprised of several fixed reactive elements in parallel that can be switched into and out of the circuit, which varies to the total reactance of the device. In disclosed embodiments, each one of these isolated circuits is comprised of a reactive element and a switch. The reactive element is typically a fixed capacitor but could also be an inductor or resistor.

Implementations of the switch circuitry may be constructed using a symmetric silicon-carbide MOSFET circuit but could be constructed from other types of transistors in a similar isolation arrangement. In a plasma generation system (discussed in more detail below) the switch circuit is in series with the reactive element, essentially floating on the incoming RF signal, the gate drives of each switch are to be galvanically and electromagnetically isolated to prevent the actuation of any switch or set of switches from influencing the state of the remaining switches.

To assist in providing isolation between individual switch portions of the overall switch circuitry as disclosed, a set of isolated power supplies is provided, such that the gate drive of each switch is powered and actuated independently. To accomplish the disclosed isolation, a constant current source pumps alternating current ("AC") current through a single main power supply loop. This main power supply loop is, in turn, magnetically coupled to each set of gate drive circuitry via an inductive coupling to an isolated switch power loop. This forms a transformer, where the single loop is the primary coil of the transformer and there are as many secondaries (i.e., secondary coils) as there are switches. Each secondary coil provides power that is rectified and filtered to form the positive (+) and negative (−) voltage rails for gate driving. In some embodiments, configuration may be set to provide a positive rail and ground ("GND"), or a positive and negative rail. These power rails are applied to the gate drive circuitry, which comprises an isolator and a buffer amplifier to provide high current to sweep the charge out of the gate quickly, and a low output impedance to reduce the influence of feedback from the Miller capacitance in the devices.

Disclosed implementations provide the use of individual isolated power supplies that allow for the gate drive circuitry (internal to the disclosed individual switches) to be as simple and robust as possible. Typically, the isolation requirements would direct the design of a gate drive transformer with additional circuitry to drive the primary of the transformer and circuitry to create the desired rectangular pulse at the secondary out of the incoming AC signal coupled from the primary.

The design of compact transformers, and the additional necessary circuitry, at high switching speeds is challenging due to the size constraints of most designs as well as the parasitics of such a circuit. Compounding this problem, is that the switch in question may be floating on hundreds or thousands of volts of high frequency RF. As a result, there may be a substantial amount of feedback through the Miller capacitance that must be handled by the gate drive circuitry. By floating the entire gate drive circuit as is done in the disclosed embodiments, no transformers or complex circuitry of any kind are necessary. In some implementations a simple isolator, which takes the input signal and couples it to the gate, and buffer amplifier, which amplifies the current applied to the gate, can be operated from the rails of the isolated power supply.

This disclosure discusses implementations of a variable gate reactance device having isolated gate drive power supplies in the context of a plasma processing system. Other uses are also possible and should be apparent to those of skill in the art, given this disclosure. Specifically, any industry or application that uses a circuit for a variable reactance network may benefit from the disclosed techniques. For example, telecommunication applications, laser cutting applications, and RADAR/LIDAR implementations are just a few possible industries that may benefit.

During plasma processing, a radio frequency ("RF") generator transmits RF alternating current ("AC") waves through RF transmission lines and networks to a plasma processing chamber. To provide an efficient transfer of power from the RF generator to the plasma processing chamber, a matching network is employed to transform the time-varying impedance presented by the plasma chamber to the optimal load impedance of the RF generator.

Many RF matching networks have variable capacitors and a control circuit with a microprocessor to control the capacitance values of the variable capacitors. There may be various configurations of RF matching networks. Herein, a vacuum variable capacitor may be defined as an electro-mechanical device which has two concentric metallic rings that are moved in relation to each other to change capacitance. The value and size of the variable capacitors within the RF matching network may be determined by the power handling capability, frequency of operation, and impedance range of the plasma processing chamber.

Pulse-Frequency Modulation ("PFM") is a commonly used technique to deliver power in plasma processing systems. Herein, Pulse-Frequency Modulation Is a modulation method where the amplitude of the carrier waveform is varied between at least two discrete power levels at some frequency with some duty cycle. As such, power delivered in a pulse-waveform may affect plasma characteristics which may therefore cause the electrical impedance of the plasma chamber to vary with each pulse waveform. At the onset of each pulse, a spike in reflected power can result.

Many RF plasma generation systems employ multi-level pulsing for various different power states. Each power state may be associated with a unique impedance because the characteristics of the plasma may change based on the delivered power to the plasma chamber. During plasma processing, the plasma changes occur very quickly (e.g., at a rate of up to hundreds of thousands of Hertz). Many matching networks, such as those that have vacuum variable capacitors, generally react on the order of hundreds or thousands of milliseconds.

Accordingly, many of these matching networks are limited to latching on to one of the multi-level power states (e.g., high or low amplitudes). For example, for dual level pulsing, a matching network may latch on to the high amplitude or to the lower amplitude state and maintain position for the duration of the other state. This means that the system will behave optimally during one state, and sub-optimally for any other states.

FIG. 1 is a block diagram of a hybrid matching network 100, according to a system and method of the present disclosure. Advantageously, the hybrid matching network 100 disclosed herein employs a two-stage tunable matching network. As shown, the hybrid matching network 100 receives its RF input from a RF generator (not shown) at RF input 109, the first-stage matching network 101 (e.g., a switch network), the second-stage matching network 103 (e.g., a mechanically-tuned matching network), a sensor element 102, and plasma chamber (e.g., illustrated as load 104) which are all coupled to one or more transmission lines 105-108. Herein, a hybrid matching network 100 may be defined as a multi-stage matching network which can operate simultaneously or in sequence to tune a load impedance to a target (e.g., source) impedance.

The first-stage matching network 101 may be responsible for matching to high-speed variations in impedance during different stages of a RF waveform and may utilize the disclosed variable reactance device with isolated gate drive power supplies. A second-stage matching network 103 may be responsible for high-Q impedance transformations. Accordingly, in several implementations of the present disclosure, the bulk of the impedance tuning is performed by the second-stage matching network 103, for high-Q transformations and the first-stage matching network 101 can be used to tune system impedance for low-Q transformations that arise from a pulsed waveform, changes in chamber conditions, or other factors. Herein, high-speed variation is defined as a change in impedance that is beyond the control loop bandwidth associated with a second-stage matching network.

The first-stage matching network may include fixed capacitors and PIN diodes, silicon-carbide field effect transistors ("SiCFETs"), metal oxide field effect transistors ("MOSFETs"), insulated gate bipolar transistors ("IGBTs"), or bipolar junction transistors ("BJTs") electronic switches and the second-stage matching network may include vacuum variable capacitors, or air variable capacitors, and stepper motors, brushed direct current ("DC") motors, brushless DC motors, or AC motors.

Advantageously, the hybrid matching system as disclosed herein can reduce the stress on the high-speed, secondary matching network (e.g., the first-stage matching network 103) and can assist in dialing in the matching network to tune the plasma system to a target impedance.

Herein, high Q or low Q refers to a high or low-quality factor. The Q-factor is defined as the ratio of energy stored in a system to the amount of energy dissipated in a system. Q-factor is a dimensionless unit and, for a single element, is expressed as the ratio between the element's reactance and its resistance. In a matching network, the minimum Q-factor is the configuration where the least amount of energy is stored for the transformation to be accomplished.

In some implementations, a high-Q impedance transformation is one that has a Q-factor that is greater than two whereas a low-Q impedance transformation is one that has a Q-factor that is less than two.

Figure 2A:
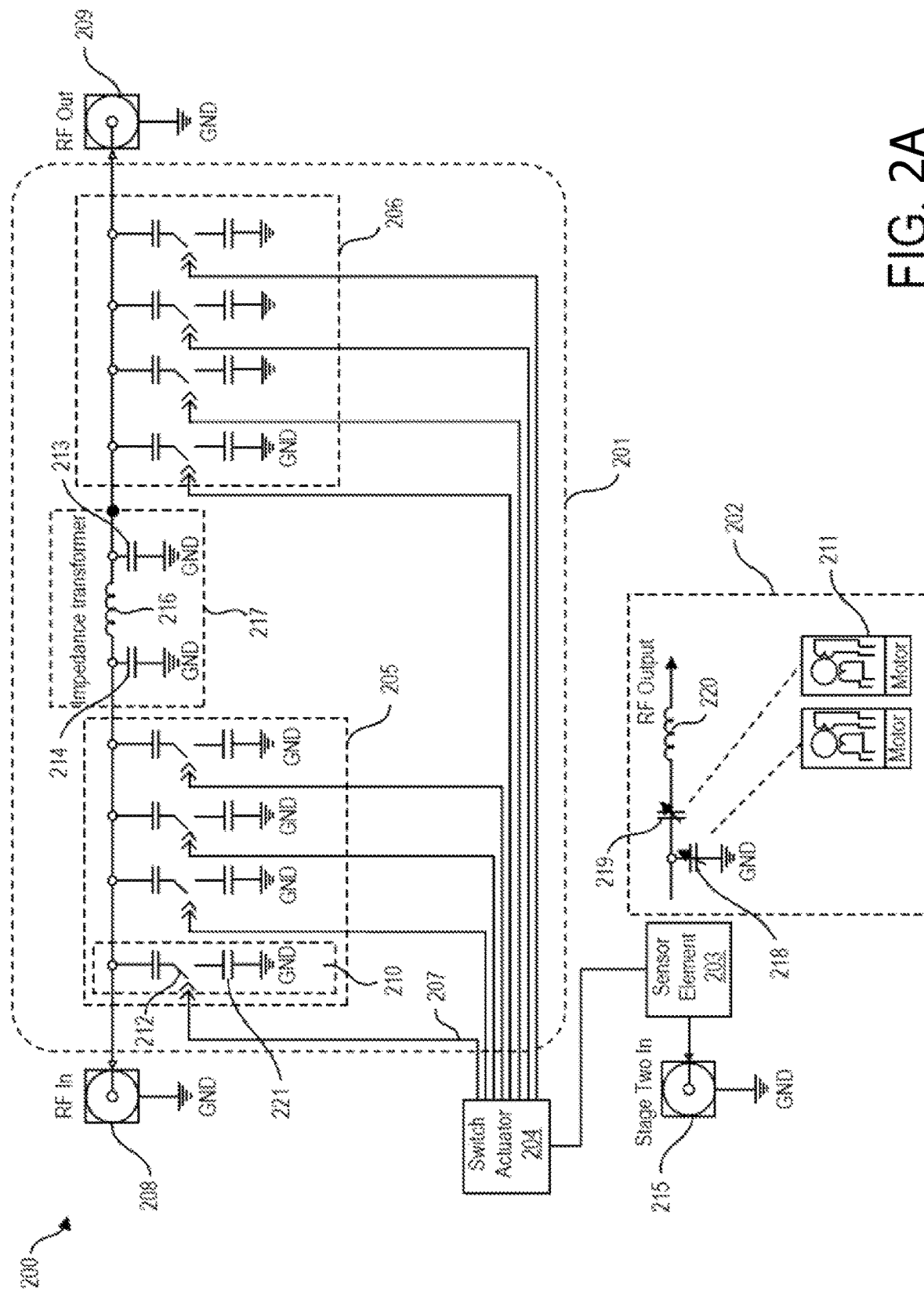
FIG. 2A is an illustration of a hybrid matching network topology, according to the present disclosure.

FIG. 2A is an illustration of a hybrid matching network 200 topology that may benefit from the disclosed variable reactance device. The hybrid matching network 200 topology illustrates a first-stage matching network 201, a second-stage matching network 202, and a sensor element 203 coupled thereto. In some implementations, the bulk of the tuning is performed by the second-stage matching network 202 whereas the first-stage matching network 201 can be employed to implement "coarse tuning" for low-level and fast impedance variations. The hybrid matching network 200 topology illustrated in FIG. 2A does not show isolated power supplies for the switch terminals 210 as that will be discussed in more detail with reference to FIGS. 2B-C below. However, contrasting the circuit of FIG. 2A with that of FIGS. 2B-C should provide a complete understanding of the disclosed switching circuitry to those of ordinary skill in the art with the other elements illustrated maintaining their function with respect to the matching network overall.

The voltage and current sensed at an output (e.g., node 209/215) of the first-stage matching network 201 can be used to direct both stages simultaneously as they act independently. The RF power is delivered by a RF generator to the system input node 208, which is delivered to a plasma chamber (not shown) by way of the hybrid matching network 200.

In the implementation shown, the first-stage matching network 201 includes an impedance transformer 217 with banks 205, 206 of switch terminals 210 (e.g., switches connected to capacitors as reactive elements) on two sides of the impedance transformer 217. Collectively, the impedance transformer 217 and the banks 205, 206 of switch terminals 210 (e.g., switched capacitors) provide the first-stage matching network 201 the flexibility to match impedances within a specified range. The impedance transformer 217 may include a lumped-element pi network or a distributed network such as a transmission line to achieve the desired impedance transformation. For example, the impedance transformer 217 may include a pi network section to perform both a step-up and step-down impedance transformation to tune to a target impedance.

The specified range of the first-stage is a design choice which can be made based on the application and the availability of devices at a given frequency and power level. Choosing a narrow range may limit stress on the first-stage for a given frequency and power level, but also limits the applications in which it may be used. Choosing a large range has the opposite consequence. In either case, the system may function similarly.

Accordingly, impedance transformer 217 may be used in conjunction with banks 205, 206 of switch terminals 210 (e.g., switched capacitors) to tune an impedance. The impedance transformer 217 may be realized by inserting a section of a transmission line with appropriate electrical length and characteristic impedance. For example, a quarter-wave impedance transformer may be used to match real impedances. However, a complex load impedance can also be transformed to a real impedance by adding a series or a shunt reactive component. Notably, a quarter-wave transformer can provide a match at a particular operating frequency as well as an acceptable match across a bandwidth of one octave, or less, depending on the quality factor, Q, of the transformation and the application.

In the implementation shown in FIG. 2A, the impedance transformer 217 includes a lumped-element pi network. The impedance transformer 217 performs the same impedance transformation as the transmission line or waveguide and can be made much more compact at lower frequencies but offers a more limited bandwidth. In one implementation, the impedance transformer 217 of lumped elements consists of capacitors 213, 214 in shunt network branches in addition to an inductor 216 in a series branch.

The banks 205, 206 of switches 212 each include an individual (e.g., RF) switch terminal 210 (in each respective bank 205, 206 of switches 212) which includes switches 212 and reactive tuning elements 221 which allow the first-stage to match a variety of load impedances. In some implementations, a look-up table stored in a memory element (not shown) of the hybrid matching network 200 may be referenced to determine the state of the switches 212 to collectively tune the output impedance of the first-stage to a complex conjugate of the calculated input impedance of the second-stage matching network. In the implementation shown in FIG. 2A, the banks 205, 206 each include four switch terminals 210 of switches 212 and therefore eight switch terminals 210 to effect impedance tuning. As will be described in more detail with respect to FIGS. 2B and 2C, the circuitry used for switch terminals 210 can be altered to have isolated power supplies for each instance of a switch 212.

In addition, a switch actuator 204 is coupled to each switch terminal 210 for each bank 205, 206 of switch terminals 210. Herein, a switch actuator is defined as the portion of the system responsible for bringing a switch terminal 210 into, or out of, the circuit by engaging (e.g., close) or disengaging (e.g., open) the switch 212 in that switch terminal 210. The switch actuator 204 may be coupled to the banks 205, 206 of switch terminals 210 by electrical, magnetic, optical, or mechanical means. In the implementation shown, the switch actuator 204 is coupled to the eight switches 212 in the banks 205, 206 of switch terminals 210. In addition, the switch actuator 204 is coupled to the sensor element 203. The sensor element 203 may operate the switch actuator 204 to engage the first-stage matching network 201.

The state of the switches 212 of the banks 205, 206 of switch terminals 210 may be expressed in a binary format. For example, a first-stage matching network 201 with the switches 212 of bank 205 all being closed and the switches 212 of bank 206 being open may be expressed as [1111 0000]. Likewise, a first-stage matching network 201 with the first half of the switches 212 of banks 205, 206 being open and the second half of the switches 212 of banks 205, 206 being closed may be expressed as [0011 0011]. In one implementation, a look-up table may be used to relate the proper configuration states of the switch terminals 210 to the readings from sensor element 203. In this case, after sensor data has been received and processed, the switch terminals 210 can be actuated to a set of states that minimizes the reflection coefficient (e.g., gamma) at the input node 208 of the first-stage.

The sensor element 203, as shown, is coupled to an input 215 of the second-stage matching network 202. The sensor element 203 can detect voltage and current, or forward and reflected coupled waves. The sensor element 203 may be a voltage and current sensor, or a bi-directional coupler which detects the voltage, current, forward, or reflected waveforms. In particular, the sensor element 203 in this embodiment measures voltage and current and calculates the relationship between the measured voltage and current in both phase and magnitude. Moreover, the sensor element 203 can detect high-speed variations in plasma chamber impedance and can use the change in impedance caused by the high-speed variations to engage the first-stage matching network 201.

It should be understood by a person having ordinary skill in the art having the benefit of this disclosure that the magnitude ratio and phase relationship of voltage and current waveforms at a particular node in a matching network can be used to direct the tunable elements in an automatic matching network. In this case, a notable aspect is the location of the sensor, and the types of information it gathers. The magnitude ratio and phase relationship of these quantities at the node where sensor element 203 exists in the system allow us to drive the second-stage matching network matching network as well as actuate the switch terminals 210 in the first-stage matching network simultaneously.

In this implementation, magnitude and phase are used to drive the tunable elements in the second-stage matching network matching network, and those same values are used to calculate the input impedance to the second-stage matching network, which is the load impedance for the first-stage matching network. When this impedance is computed, the switch terminals 210 are actuated such that the output impedance of the first-stage is the complex conjugate of the calculated load impedance. These operations occur simultaneously and independently.

As the second-stage matching network 202 self-adjusts its tunable elements to achieve a minimization of gamma looking into its input 215, it is constantly presenting some load at the input to the first-stage. Therefore, under any circumstance where the impedance looking into node 215 is approximately the complex conjugate of one of the available configurations of switch terminals 210, the first-stage can minimize gamma looking into input node 208, which is the input to the hybrid matching system. As the second-stage matching network continuously drives towards minimum gamma at node 215, the first-stage can continue to actuate switch terminals 210 to maintain the most optimal impedance match at input node 208.

FIG. 2A also shows an illustration of the second-stage matching network 202. In some implementations, the second-stage matching network 202 may be configured similarly to conventional matching networks. For instance, the second-stage matching network 202 may include one or more variable capacitors 218, 219 and an inductor 220. The variable capacitors 218, 219 may be adjusted, for example, by a lead screw (not shown) in a mechanical means (e.g., using motors 211) to transform the impedance presented by a plasma chamber (not shown) to match a target impedance (e.g., source impedance, typically 50 ohms).

Figure 2B:
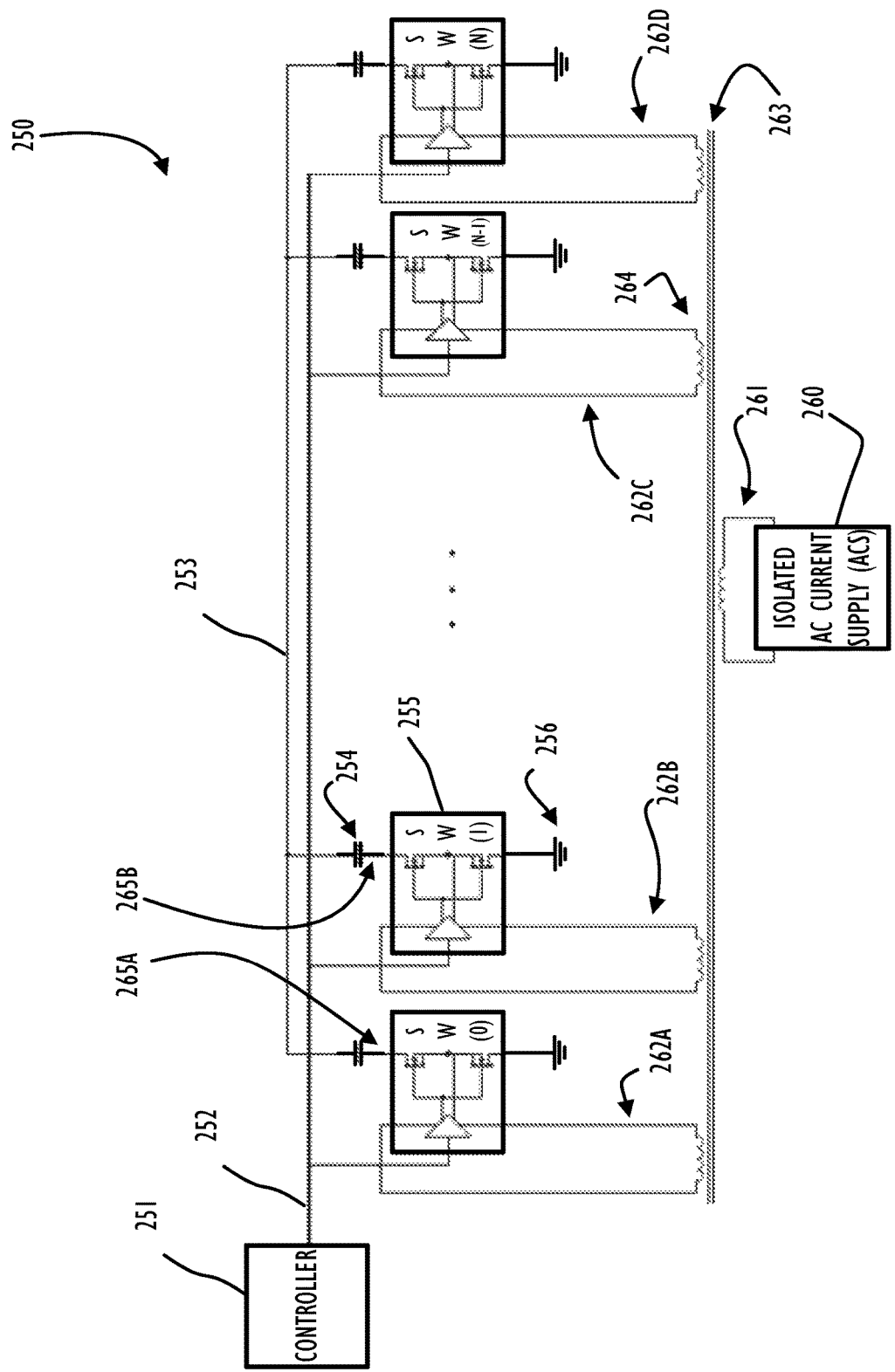
FIG. 2B is an illustration of a portion of a first-stage of a hybrid matching network topology including a variable reactance device having isolated gate drive power supplies, according to the present disclosure.
Figure 2C:
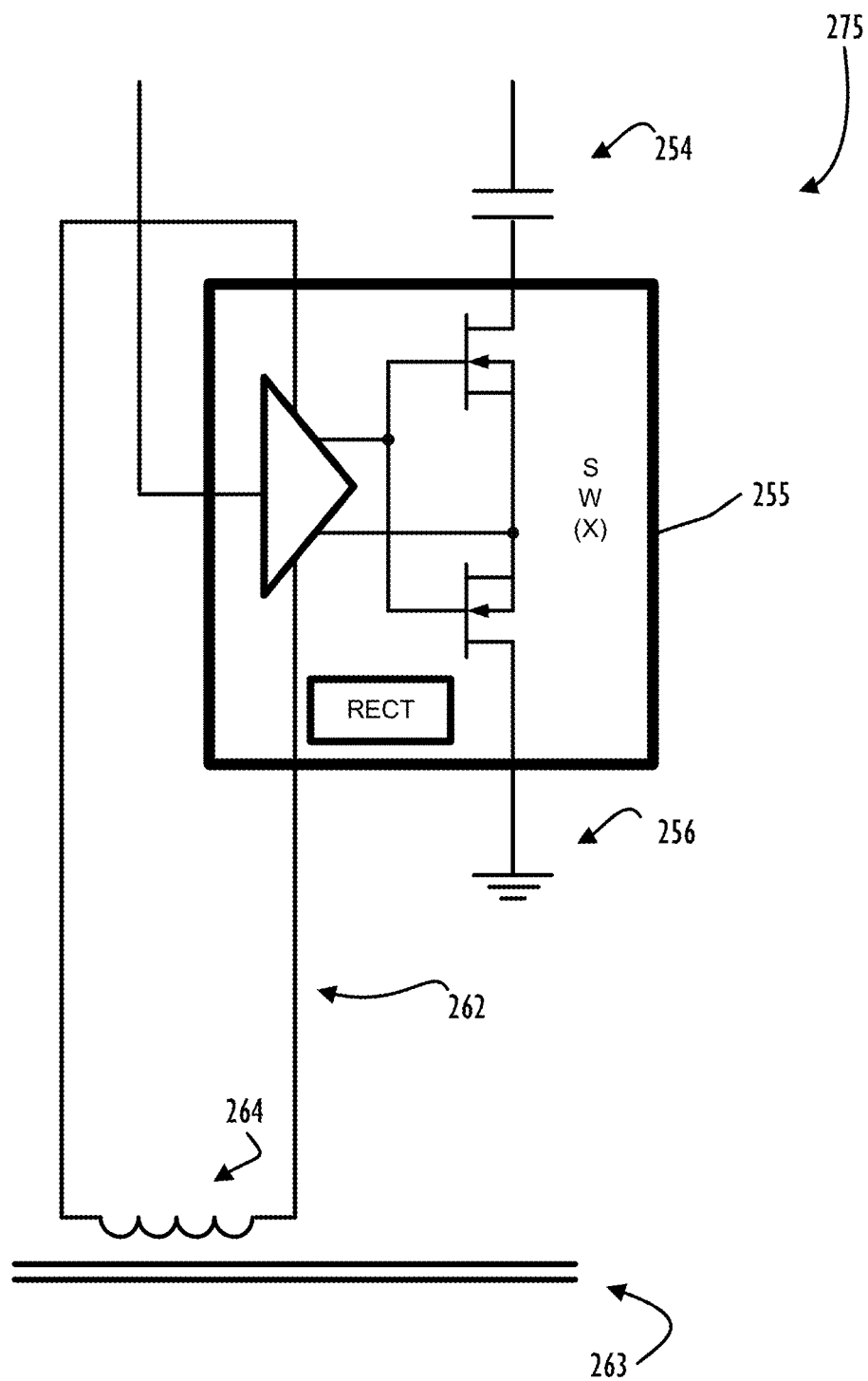
FIG. 2C is an enlargement of a single switch portion of the variable reactance device of FIG. 2B.

Referring now to FIGS. 2B-2C, FIG. 2B illustrates a variation to some of the switch circuitry that may be used in the first-stage (switching) matching network. FIG. 2C illustrates an enlarged view of a single switch from the view shown in FIG. 2B. As mentioned above, a benefit may be realized by providing isolation of power for different switches within the variable reactance device as is illustrated in FIG. 2B where each power loop 262A through 262D is isolated from one another.

The switching circuitry 250 of FIG. 2B is connected to controller 251 via data bus 252. Controller 251 may be a processor, digital signal processor ("DSP"), microprocessor, or some other type of computer processor. As mentioned above, the data signals between switching circuitry 250 and controller 251 (via data bus 252) may be binary bits that form an indication of the switching state of the gates within the variable reactance device. That data signal may be provided by controller 251 via data bus 252 in the form of electrical or optical signals. If data bus 252 is implemented optically, an optical breakpoint (e.g., a device to provide optical isolation) to convert the signal from electrical to optical may be provided somewhere along the data signal path. In some cases, conversion to an optical signal may reduce further interference caused to, or caused by, the data signal if it were to be electrical. Controller 251 of FIG. 2B provides similar functionality as does the combination of switch actuator 204 and sensor element 203 from FIG. 2A. In fact, the set of individual lead lines 207 entering switch actuator 204 are another representation of a data bus such as data bus 252.

In FIG. 2B, switching circuitry 250 is also connected to an isolated gate drive power supply unit ("PSU") 260. As illustrated, an inductive circuit power loop 261 is output from PSU 260 and provides inductive power as indicated by parallel lines 263 to indicate a magnetic coupling between power loops. As illustrated, parallel lines 263 are adjacent to a series of inductive pickups representing the second coil of a transformer as indicated by coil 264 in isolated power loop 262C. Importantly, note that each of power loop 262A, 262B, 262C, and 262D are isolated from each other because of physical separation and are isolated from the main power supply via an inductive coupling. Accordingly, each power loop 262A-D provides power for a respective one (and only one) switch 255 from the plurality of switches (i.e., switch (0), switch(1) . . . switch (N−1), and switch(N)) illustrated for switching circuitry 250.

Associated with each switch 255 there is a ground 256, a signal for a reactive element 254, a connection to data bus 252, and a connection to the associated isolated power loop 262A-D. In this example, reactive element 254 is illustrated as a capacitor. However, in other implementations the reactive element may be an inductor, resistor, or some other type of electrical circuitry. Each reactive element 254 is also connected to node 253 that is shared across all present reactive elements (254).

In use, PSU 260 creates a constant AC current through a loop (e.g., power loop 261) that is magnetically coupled to an individual power loop (e.g., a respective one of power loops 262A-D) for each of a series of individual switches 255. These switches 255 will be either on or off (e.g., based on receiving a signal of 1 or 0 from controller 251 via data bus 252). It has been determined to be beneficial to have independence across power supply loops for cases when an individual switch 255 may be floating on the high voltage up and down or that switch may be being pulled to ground. Also, there may be a high differential voltage across different switches. Specifically, the differential voltage from point 265A associated with switch(0) may be high relative to point 265B associated with switch(1).

FIG. 2C illustrates (at larger scale) view 275 which is an individual switch as might be extracted from the switching circuitry 250 shown in FIG. 2B. Inside switch 255 there are different elements to perform rectifier filtering ("RECT"), amplification, etc. that make up the aforementioned gate drive circuitry. In this example, this circuitry drives the gate of the symmetrical FET (field effect transistor) switch. However, the internals of switch 255 may vary based on implementation and will not be discussed further. It is important to note that whatever the internals to switch 255 might be, they are provided power from an individual and isolated power loop 262 that receives its power from coil 264 and its association with parallel lines 263. Each instance of switch 255 may be set as indicated by control signals from controller 251.

Figure 3:
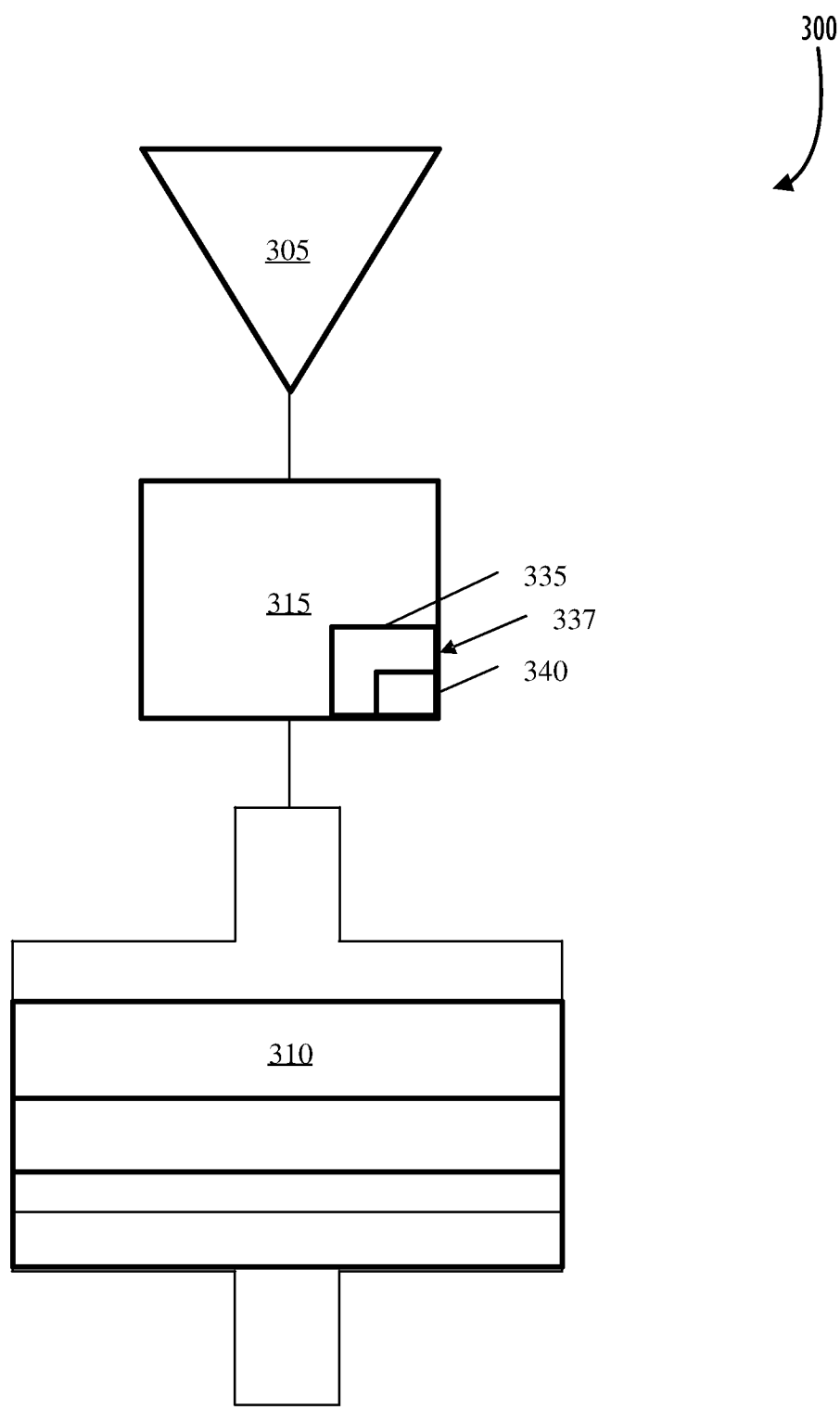
FIG. 3 is a schematic representation of a plasma processing device according to embodiments of the present disclosure.

Turning to FIG. 3, a schematic representation of a radio frequency plasma processing device 300 (that may be implemented using switching circuitry and matching networks according to embodiments of the present disclosure) is shown. In this embodiment, radio frequency plasma processing device 300 includes a radio frequency generator 305. Radio frequency generator 305 is configured to provide power to reaction chamber 310. Radio frequency generator 305 may provide power at a radio frequency between about 400 KHz and about 150 MHz. In certain embodiments, a second radio frequency generator (not shown) may also be present within radio frequency plasma processing device 300 and may provide power at a radio frequency that is the same, lower, or higher than radio frequency generator 305.

Reaction chamber 310 may include various components that allow for the processing of a manufacturing operation, such as those associated with the semiconductor industries. Reaction chamber 310 may include one or more sensors (not shown) for measuring certain properties occurring within reaction chamber 310. Reaction chamber 310 may also include a pedestal (also not shown) on which substrates to be manufactured may be placed during operation. Reaction chamber 310 may also include or otherwise be connected to coils (not individually shown), such as those discussed above, as well as showerheads, etc.

Radio frequency plasma processing device 300 may also include a matching network 315 (an example of a matching network 200 is illustrated and discussed above). Matching network 315 may be located between radio frequency generator 305 and reaction chamber 310. Matching network 315 may include variable capacitors (not shown), as well as other components to balance impedance between radio frequency generator 305 and reaction chamber 310, as discussed in greater detail above. During operation, the matching network may be tuned, e.g., by adjusting capacitor positions, in order to provide the matching impedances.

During operation, as power is supplied from radio frequency generator 305 to a plasma (not shown) within reaction chamber 310, a condition may occur, such as power may be reflected from reaction chamber 310. Such reflected power may result in undesirable conditions, which result in inefficient processing, damage to a substrate, damage to components of radio frequency plasma processing device 300, and the like. To resolve the condition and improve operability of radio frequency processing device 300, a tuning module 337 includes programmable logic controller ("PLC") 335 that may provide commands to matching network 315 to adjust a capacitor position, thereby providing matching impedances to minimize reflected power. Programmable logic controller 335 may be connected to storage device 340 to store these commands or data obtained during operation.

During operation, programmable logic controller 335 may identify a capacitor within matching network 315. The identifying may occur automatically or be controlled by an operator. Along with identifying the capacitor, the impedance of the matching network as a whole may be measured. Measuring the impedance of matching network 315 as a whole (e.g., by using one or more of sensors distributed throughout the matching network) may include measuring a plurality of impedance values for one or more capacitors and/or other components within matching network 315. The capacitor may then be driven from a zero step value, which represents the point of minimum capacitance within its usable range to a higher step value to increase its capacitance and thereby tune the network (e.g., reduce power reflections).

While the present disclosure may have been shown and described with reference to various embodiments thereof, it will be understood by those skilled in the art that various changes in form and details may be made therein without departing from the spirit and scope of the present disclosure as defined by the appended claims and their equivalents. In other words, the various exemplary embodiments disclosed in the present specification and drawings are merely specific embodiments to facilitate an understanding of the various aspects of the present disclosure and are not intended to limit the scope of the present disclosure. For example, the particular ordering of steps may be modified or changed without departing from the scope and spirit of the present disclosure. Therefore, the scope of the present disclosure is defined not by the detailed description of the disclosure but by the appended claims, and all differences within the scope should be construed as being included in the present disclosure.

What is claimed is:

1. A switch circuit, comprising:
   a plurality of switching elements to each receive an output signal from a controller;
   a plurality of reactive elements, each reactive element connected to a respective one of the plurality of switching elements; and
   a main power supply inductively coupled to a plurality of individual isolated power supply loops, each of the plurality of individual isolated power supply loops connected to the respective one of the plurality of switching elements and not including the reactive element.

2. The switch circuit of claim 1, wherein the output signal is provided from the controller via a data bus.

3. The switch circuit of claim 2, wherein the data bus is an optical data bus.

4. The switch circuit of claim 3, further comprising:
   an optically isolated connection positioned between each of the plurality of switching elements and the data bus that connects the plurality of switching elements to the controller.

5. The switch circuit of claim 2, wherein the plurality of switching elements collectively receive a binary signal via the data bus.

6. The switch circuit of claim 1, wherein:
each of the plurality of switching elements includes drive circuitry comprising:
a rectifier,
one or more filters; and
an amplifier.

7. The switch circuit of claim 1, wherein the plurality of reactive elements includes a plurality of capacitors.

8. The switch circuit of claim 1, wherein the plurality of reactive elements includes a plurality of inductors, resistors, or a combination thereof.

9. The switch circuit of claim 1, further comprising a main power loop including a primary coil powered by a power supply unit, the primary coil inductively coupled to a plurality of secondary coils that are each included in one of the plurality of individual isolated power supply loops.

10. A hybrid matching network comprising:
a multi-stage tunable matching network including a first-stage switched matching network and a second-stage mechanically-tuned matching network;
a sensor electrically connected between the first-stage switched matching network and the second-stage mechanically-tuned matching network, the sensor to determine phase and magnitude of an electrical signal; and
a load electrically connected to the second-stage mechanically-tuned matching network, wherein the first-stage switched matching network includes a switch circuit comprising:
a plurality of switching elements to each receive an output signal from a controller;
a plurality of reactive elements each connected to a respective one of the plurality of switching elements; and
a main power supply inductively coupled to a plurality of individual isolated power supply loops, each of the plurality of individual isolated power supply loops connected to the respective one of the plurality of switching elements.

11. The hybrid matching network of claim 10, wherein the output signal is provided from the controller via a data bus.

12. The hybrid matching network of claim 11, wherein the plurality of switching elements collectively receive a collection of binary signals via the data bus.

13. The hybrid matching network of claim 10, wherein:
each of the plurality of switching elements includes drive circuitry comprising:
a rectifier,
one or more filters; and
an amplifier.

14. The hybrid matching network of claim 10, wherein the plurality of reactive elements includes a plurality of capacitors.

15. The hybrid matching network of claim 10, wherein the plurality of reactive elements includes a plurality of inductors, resistors, or a combination thereof.

16. The hybrid matching network of claim 10, further comprising a main power loop including a primary coil powered by a power supply unit, the primary coil inductively coupled to a plurality of secondary coils that are each included in one of the plurality of individual isolated power supply loops.

17. A radio frequency plasma processing device comprising:
a reaction chamber;
a radio frequency generator to supply radio frequency power to a plasma in the reaction chamber;
a multi-stage tunable matching network including a first-stage switched matching network and a second-stage mechanically-tuned matching network;
a sensor electrically connected between the first-stage switched matching network and the second-stage mechanically-tuned matching network, the sensor to determine phase and magnitude of an electrical signal; and
a load from the reaction chamber electrically connected to the second-stage mechanically-tuned matching network,
the first-stage switched matching network including a switch circuit comprising:
a plurality of switching elements to each receive an output signal from a controller;
a plurality of reactive elements, each reactive element connected to a respective one of the plurality of switching elements; and
a main power supply inductively coupled to a plurality of individual isolated power supply loops, each of the plurality of individual isolated power supply loops connected to the respective one of the plurality of switching elements.

18. The radio frequency plasma processing device of claim 17, wherein the output signal is provided from the controller via a data bus.

19. The radio frequency plasma processing device of claim 17, wherein:
each of the plurality of switching elements includes drive circuitry comprising:
a rectifier,
one or more filters; and
an amplifier.

20. The radio frequency plasma processing device of claim 17, wherein the switch circuit further comprises a main power loop including a primary coil powered by a power supply unit, the primary coil inductively coupled to a plurality of secondary coils that are each included in one of the plurality of individual isolated power supply loops.

* * * * *